United States Patent
Hahakura et al.

(10) Patent No.: US 6,192,573 B1
(45) Date of Patent: Feb. 27, 2001

(54) METHOD OF PREPARING OXIDE SUPERCONDUCTING WIRE

(75) Inventors: Shuji Hahakura; Nobuhiro Saga; Kazuya Ohmatsu; Kenichi Sato, all of Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 09/055,287

(22) Filed: Apr. 6, 1998

Related U.S. Application Data

(62) Division of application No. 08/823,907, filed on Mar. 25, 1997.

(30) Foreign Application Priority Data

Mar. 26, 1996 (JP) .................................................. 8-070098

(51) Int. Cl.$^7$ ...................................................... H01L 39/24

(52) U.S. Cl. ......................... 29/599; 174/125.1; 505/231; 505/704

(58) Field of Search ............................... 29/599; 505/431, 505/231, 704; 174/125.1

(56) References Cited

U.S. PATENT DOCUMENTS

| | | | | |
|---|---|---|---|---|
| 4,414,428 | * | 11/1983 | McDonald ........................... | 29/599 X |
| 4,501,062 | * | 2/1985 | Hillmann et al. ...................... | 29/599 |
| 4,652,697 | * | 3/1987 | Ando et al. ........................... | 29/599 X |
| 4,885,273 | * | 12/1989 | Sugimoto et al. .................... | 29/599 X |
| 4,952,554 | * | 8/1990 | Jin et al. ............................... | 29/599 X |
| 5,068,219 | * | 11/1991 | Hagino et al. ........................ | 29/599 X |
| 5,232,908 | * | 8/1993 | Shiga et al. ........................... | 29/599 X |
| 5,283,232 | * | 2/1994 | Kohno et al. ......................... | 29/599 X |
| 5,340,943 | * | 8/1994 | Sato ...................................... | 29/599 X |
| 5,885,938 | * | 3/1999 | Otto et al. ............................. | 29/599 X |

FOREIGN PATENT DOCUMENTS

| | | | |
|---|---|---|---|
| 0451864A2 | | 10/1991 | (EP) . |
| 0503525A1 | * | 3/1992 | (EP) . |
| 0134822 | * | 5/1989 | (JP) ...................................... 29/599 |
| 4-262308 | | 9/1992 | (JP) . |
| 4-329218 | | 11/1992 | (JP) . |
| 5-101722 | * | 4/1993 | (JP) ..................................... 505/431 |
| 5-250937 | * | 9/1993 | (JP) ..................................... 505/431 |
| 6-44832 | * | 2/1994 | (JP) ..................................... 505/431 |
| 6-44833 | * | 2/1994 | (JP) ..................................... 505/431 |
| 6-68729 | * | 3/1994 | (JP) ..................................... 505/431 |
| 6-208809 | * | 7/1994 | (JP) ..................................... 505/431 |

OTHER PUBLICATIONS

C.H. Rosner et al., "Status of HTS Superconductors: Progress in Improving Transport Critical Current Densities in HTS Bi–2223 Tapes and Coils", Cryogenics, vol. 32, No. 11, (1992), pp. 940–948.

* cited by examiner

*Primary Examiner*—Carl J. Arbes
(74) *Attorney, Agent, or Firm*—Foley & Lardner

(57) ABSTRACT

An oxide superconducting wire having a circular or substantially circular sectional shape and exhibiting a high critical current density comparable to that of a tape-shaped wire is provided. The oxide superconducting wire consists of a plurality of filaments extending along the longitudinal direction of the wire in the form of ribbons, and a stabilizer matrix covering the filaments. The aspect ratio of the width to the thickness of each filament is 4 to 40, and the thickness of each filament is 5 to 50 $\mu$m. A section of the wire is in a circular or substantially circular shape. The wire exhibits a critical current density of at least 2000 A/cm$^2$ at a temperature of 77 K with no application of a magnetic field. It is preferable that the plurality of filaments are substantially rotation-symmetrically arranged with respect to the center of the wire. It is also preferable that a hexagonal-prismatic stabilizing matrix is provided at the center of the wire and the plurality of filaments covered with the stabilizer matrix are arranged on each side surface thereof in a layered manner. A flat stranded wire having low ac loss can be formed by such wires.

8 Claims, 9 Drawing Sheets

(a)

(b)

METHOD OF PREPARING OXIDE SUPERCONDUCTING WIRE

This application is a divisional of application Ser. No. 08/823,907, filed Mar. 25, 1997.

BACKGROUND OF THE INVENTION

1. Field of the Invention

The present invention relates to a wire employing an oxide superconductor and a method of preparing the same, and a stranded wire and a conductor employing such wires, and more particularly, it relates to a wire having a substantially circular sectional shape or a polygonal sectional shape which is substantially rotation-symmetrical and exhibiting a high critical current density, and structures of a stranded wire and a conductor having small ac loss employing the wire.

2. Description of the Background Art

Among conventional oxide superconducting silver sheath wires, a round wire having a circular section exhibits an extremely small critical current density as compared with a tape-shaped wire obtained through rolling. This is conceivably because the density of a superconductor is not increased in the wire due to absence of a rolling step in the process of preparing the round wire. This is also conceivably because superconducting crystals are not oriented by a lamellar structure which is specific to a bismuth superconductor due to the absence of the rolling step and hence c-axis orientation unsatisfactorily results from crystal growth in sintering.

As a result of development of long wires having critical current densities exceeding $10^4$ A/cm$^2$, application of silver sheath bismuth oxide superconducting wires to superconducting power apparatuses with liquid nitrogen cooling is expected. Among such silver sheath bismuth oxide superconducting wires, however, only the so-called tape-shaped wire satisfies a practical critical current density, a long wire shape, a mass production technique and the like under the present circumstances. The tape-shaped wire is prepared by charging powder serving as raw material for a bismuth oxide superconductor in a silver pipe, drawing the same, engaging a plurality of such drawn silver pipes in a silver pipe for obtaining a multifilamentary wire, further drawing the wire, and thereafter rolling and heat treating the same.

Although a high capacitance conductor is experimentally prepared by spirally winding the tape-shaped wire on a cylindrical pipe for attaining a multilayer structure, high ac loss may be generated from the structure.

In ac application of a superconducting wire, ac loss resulting from a fluctuating magnetic field comes into question. In a conductor prepared by assembling superconducting wires, on the other hand, a problem of current drift arises from ununiform impedances between the wires. Due to such drift, ac loss generated in the conductor disadvantageously exceeds the sum of those generated in the respective wires forming the conductor. This problem takes place in a conductor obtained by superposing tape-shaped wires in a layered manner.

In a conventional conductor employing metal superconducting wires, impedances of filaments or the wires are uniformalized by twisting the filaments or the wires or through transposition of the filaments. Also in such a conductor employing oxide superconducting wires, it is important to employ round wires in which current drift is prevented by transposition of the superconductor itself, in order to reduce ac loss. In order to obtain a high critical current density in the oxide superconductor of ceramics, however, it has been necessary to reinforce grain bonding and increase crystal orientation by shaping the wire into a tape and sintering the same.

The oxide superconductor has a characteristic that the c-axis is oriented on an interface between the same and a metal, and its critical current density is improved with improvement of the c-axis orientation. The tape-shaped oxide superconducting wire has a high critical current density since its c-axis orientation is improved by pressing or rolling in working into a tape shape, and further the density of a superconducting crystal portion is increased. In case of preparing a round wire, however, only an extremely low critical current density has been attained as compared with the tape-shaped wire due to absence of the pressing or rolling step.

Japanese Patent Laying-Open No. 4-262308 (1992) discloses a round oxide superconducting wire having a section in which a metal, silver or a silver alloy and an oxide superconductor are alternately concentrically stacked with each other, for improving the critical current density. This gazette describes that c-axis orientation can be attained in this wire by alternately stacking the metal and the oxide superconductor for attaining a multiring structure and reducing the distance between the interfaces between the oxide superconductor and the metal, specifically to not more than 100 μm between adjacent interfaces. Although this wire exhibits a critical current density which is higher by one order as compared with other conventional round wires, however, this critical current density value is smaller by one order as compared with the tape-shaped wire, i.e., by far lower than a practically required critical current density level.

Another example aiming at improving the critical current density of the round superconducting wire is disclosed in Cryogenics (1992) Vol. 32, No. 11, pp. 940 to 948. In the round wire described in the literature, 55 single-filamentary rods having rectangular sections are concentrically arranged in a silver tube in three layers. No critical current is decided as to the obtained wire in the literature. However, it is presumable that the critical current density of the wire described in the literature is not much high, as described later.

SUMMARY OF THE INVENTION

An object of the present invention is to provide an oxide superconducting wire having a circular sectional shape or a sectional shape similar thereto and exhibiting a high critical current density comparable to that of the tape-shaped wire.

Another object of the present invention is to provide a stranded wire or a conductor employing a plurality of oxide superconducting wires, which can further reduce ac loss.

The oxide superconducting wire according to the present invention is prepared by a powder-in-tube method, and comprises a plurality of filaments consisting essentially of an oxide superconductor and extending along the longitudinal direction of the wire in the form of ribbons, and a matrix consisting essentially of a stabilizer covering the plurality of filaments. In this wire, the aspect ratio of each ribbon-shaped filament is within the range of 4 to 40, and its thickness is within the range of 5 to 50 μm. The wire has a substantially circular sectional shape or an at least hexagonal polygonal sectional shape which is substantially rotation-symmetrical, and exhibits a critical current density of at least 2000 A/cm$^2$ with no application of a magnetic field at a temperature of 77 K.

The wire according to the present invention can be provided with a prismatic stabilizing matrix having an at least hexagonal substantially regular-polygonal sectional shape substantially at its center, and the filaments covered with the stabilizer are stacked on each side surface of the prismatic stabilizing matrix in one or more layers. The prismatic matrix can have a substantially regular-hexagonal sectional shape, for example.

The wire according to the present invention can be provided with a substantially cylindrical stabilizing matrix having a substantially circular sectional shape substantially at its center, and the plurality of filaments covered with the stabilizer can be spirally arranged around the substantially cylindrical stabilizing matrix.

In the wire according to the present invention, the oxide superconductor is preferably prepared from a bismuth based oxide superconductor mainly composed of a bismuth 2223 or 2212 phase, while the stabilizer is preferably prepared from any material selected from the group consisting of silver, silver alloys and combinations thereof.

A method according to the present invention is adapted to prepare an oxide superconducting wire comprising a plurality of filaments consisting essentially of an oxide superconductor covered with a stabilizer, and comprises the steps of charging powder of an oxide superconductor or raw material therefor in a tube consisting essentially of a stabilizer, performing plastic working on the tube charged with the powder to obtain a tape-shaped wire, charging a plurality of such tape-shaped wires in a tube consisting essentially of a stabilizer, performing plastic working on the tube charged with the tape-shaped wires to obtain a wire having a substantially circular sectional shape or an at least hexagonal polygonal sectional shape which is substantially rotation-symmetrical, and heat treating the wire for forming a sintered body of the oxide superconductor. In each tape-shaped wire charged in the tube, a portion consisting of the powder is in the form of a ribbon having an aspect ratio of 4 to 40.

In the method according to the present invention, the wire having a substantially circular sectional shape or a polygonal sectional shape which is substantially rotation-symmetrical is heat treated to obtain an oxide superconducting wire comprising the filaments consisting essentially of an oxide superconductor and each having a thickness within the range of 5 to 50 $\mu$m.

In the method according to the present invention, the step of charging the plurality of tape-shaped wires in the tube consisting essentially of a stabilizer can comprise the steps of arranging a prismatic stabilizer having an at least hexagonal substantially regular-polygonal sectional shape substantially at the center of the tube and stacking the tape-shaped wires on each side surface of the prismatic stabilizer in one or more layers.

In the method according to the present invention, the step of charging the plurality of tape-shaped wires in the tube consisting essentially of a stabilizer can comprise the steps of providing a substantially cylindrical stabilizer having a substantially circular sectional shape, arranging the plurality of tape-shaped wires on a sheet consisting essentially of a stabilizer in parallel with each other, winding the sheet provided with the plurality of tape-shaped wires on the substantially cylindrical stabilizer, and inserting the same in the tube.

In the method according to the present invention, the plurality of tape-shaped wires can be charged in the tube in a charge density of at least 90%, for example, in the step of charging the plurality of tape-shaped wires in the tube consisting essentially of a stabilizer.

In the method according to the present invention, the step of performing plastic working on the tube charged with the tape-shaped wires preferably comprises drawing with a driving roller die.

In the method according to the present invention, the aforementioned heat treatment may be followed by the steps of performing drawing for attaining an area reduction ratio of at least 5% and not more than 50% in the section of the wire and then heat treating the wire for sintering the oxide superconductor. The drawing for attaining the area reduction ratio of at least 5% and not more than 50% can be performed with a driving roller die.

In the method according to the present invention, the stabilizer is preferably selected from the group consisting of silver, silver alloys and combinations thereof, and the heat treatment is preferably performed at a temperature in the range of 700 to 900° C., while filaments consisting essentially of a bismuth based oxide superconductor mainly composed of a bismuth 2223 or 2212 phase are preferably formed.

On the other hand, a superconducting stranded wire employing the inventive oxide superconducting wire is provided. The superconducting stranded wire is characterized in that a plurality of oxide superconducting wires according to the present invention are twined and the stranded wire is flatly shaped.

In the superconducting stranded wire according to the present invention, a structure having the oxide superconducting wire twisted can be provided.

In the superconducting stranded wire according to the present invention, a high-resistance metal layer or an insulating layer can be formed around the oxide superconducting wires.

Further, a stranded wire can be provided by winding the oxide superconducting wire or wires comprising filaments consisting essentially of an oxide superconductor and a stabilizer covering the same, on the aforementioned superconducting stranded wire.

In addition, a superconducting conductor employing the superconducting stranded wires is provided according to the present invention. The superconducting conductor is characterized in that the superconducting stranded wire is spirally wound on a cylindrical or spiral core in one or more layers.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
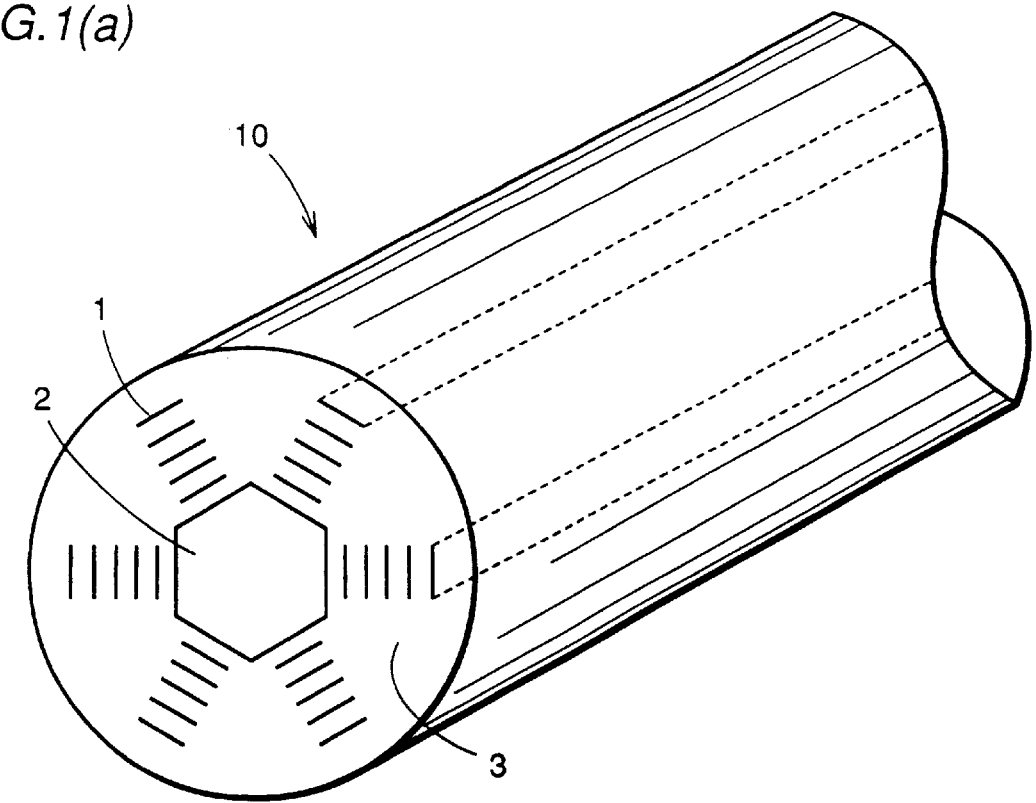
FIGS. 1(*a*) and 1(*b*) are perspective views schematically showing two exemplary structures of the wires according to the present invention respectively.

An oxide superconducting wire according to the present invention is a multifilamentary wire having such a structure that a plurality of oxide superconductor filaments are embedded in a stabilizer matrix. In this structure, each filament is in the form of a ribbon extending along the longitudinal direction of the wire. Each filament has a rectangular or substantially rectangular section. The aspect ratio of the ribbon-shaped filament, i.e., the ratio of the width of the filament to its thickness, is within the range of 4 to 40, preferably within the range of 4 to 20, more preferably within the range of 5 to 20. If the aspect ratio is smaller than 4, it is difficult to sufficiently orient c-axes of crystal grains for obtaining a superconducting phase exhibiting a high critical current density. In the wire described in the aforementioned literature Cryogenics (1992) Vol. 32, No. 11, pp. 940–948, the aspect ratio of each tape-shaped superconducting filament should be about 3 at the most. It is presumed that the filament having such a low aspect ratio does not exhibit a high critical current density due to insufficient orientation of c-axes of crystal grains. If the aspect ratio of the filament is larger than 40, on the other hand, it is not easy to form the filament, and longitudinal bonding of the superconducting phase is extremely easy to separate.

In the wire according to the present invention, the thickness of each filament is within the range of 5 to 50 $\mu$m, preferably within the range of 10 to 50 $\mu$m. If the thickness of the filament is smaller than 5 $\mu$m, bonding of the superconducting phase in the longitudinal direction is extremely easy to separate. If the thickness of the filament is larger than 50 $\mu$m, on the other hand, the ratio of interfacial portions of the filaments which are in contact with the stabilizing matrix is so small that it is difficult to sufficiently obtain a superconducting phase having c-axes oriented in a specific direction. In the filaments having the aspect ratio of 4 to 40 and the thickness of 5 to 50 $\mu$m, c-axes of crystal grains forming the superconducting phase are oriented substantially perpendicularly to the longitudinal direction of the wire. In these ranges, oxide superconducting filaments having sufficient densities and high critical current densities are attained in the wire having a circular sectional shape or an at least hexagonal polygonal sectional shape which is substantially rotation-symmetrical. In relation to a rotation-symmetrical polygonal sectional shape, that having an angle of rotation of not more than 90° with respect to a symmetry axis, i.e., that having an at least four-fold axis of symmetry, is more preferable.

The present invention provides a wire having a circular or substantially rotation-symmetrical n-gonal (n: integer of at least 6) section, of which superconducting properties such as the critical current density and the like are not substantially varied with the direction of application of a magnetic field. In the wire according to the present invention, the plurality of filaments are more preferably arranged at random, or rotation-symmetrically with respect to the center of the wire, in the stabilizer matrix. A section of the wire is preferably in the form of a substantially rotation-symmetrical n-gon (n: even number of at least 6) or a circle. In the wire having such a section, the aforementioned filaments bring out a critical current density of at least 2000 A/cm$^2$.

Figure 1B:
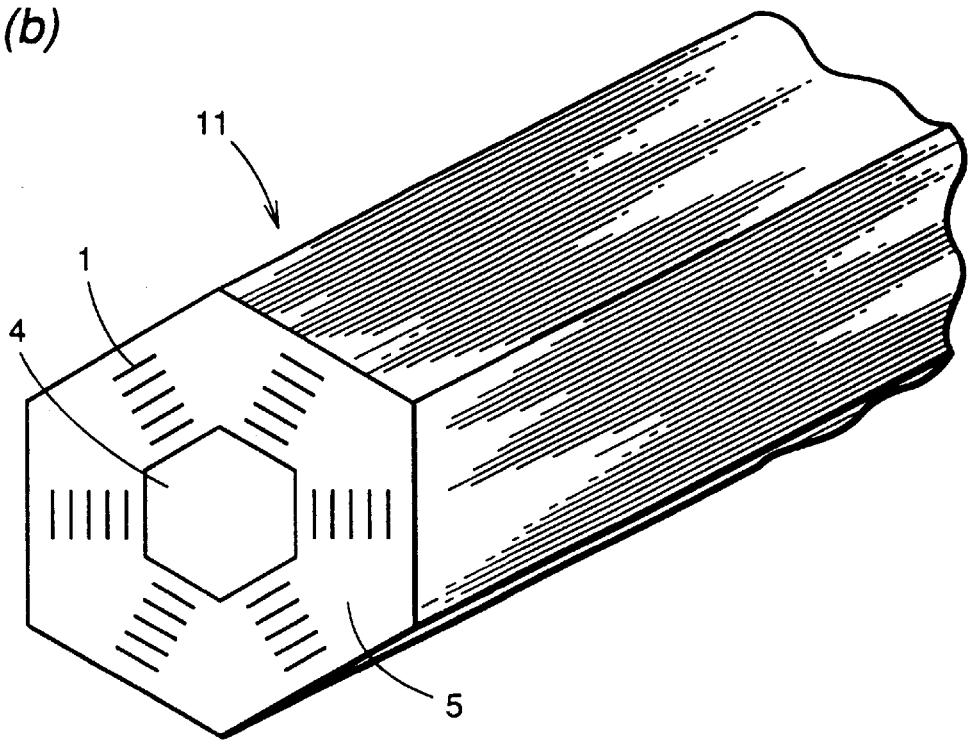

The structure of the wire according to the present invention is now described by referring to specific examples. FIGS. 1(a) and 1(b) are perspective views showing exemplary structures of the wires according to the present invention respectively, while highlighting sections of the wires in particular. In an oxide superconducting wire 10 shown in FIG. 1(a), a number of filaments 1 are covered with a stabilizer matrix 3 respectively. The filaments 1 are in the form of ribbons, as shown by dotted lines. The stabilizer is prepared from silver or silver alloys, for example. The silver alloys include Ag—Au, Ag—Mn, Ag—Al, Ag—Sb, Ag—Ti alloys, and the like. A stabilizing matrix 2 having a substantially regular-hexagonal section is provided at the center of the wire 10 having a circular section. The filaments 1 covered with the stabilizer are stacked on each side surface of the hexagon-prismatic stabilizing matrix 2. The filaments 1 are substantially symmetrically arranged with respect to the center of the wire 10. On the other hand, a wire 11 shown in FIG. 1(b) has a regular-hexagonal section. A hexagon-prismatic stabilizing matrix 4 is provided at the center of the wire 11, and filaments 1 covered with a stabilizer 5 are stacked on each side surface thereof. The filaments 1 are substantially symmetrically arranged with respect to the center of the wire 11.

Figure 2:
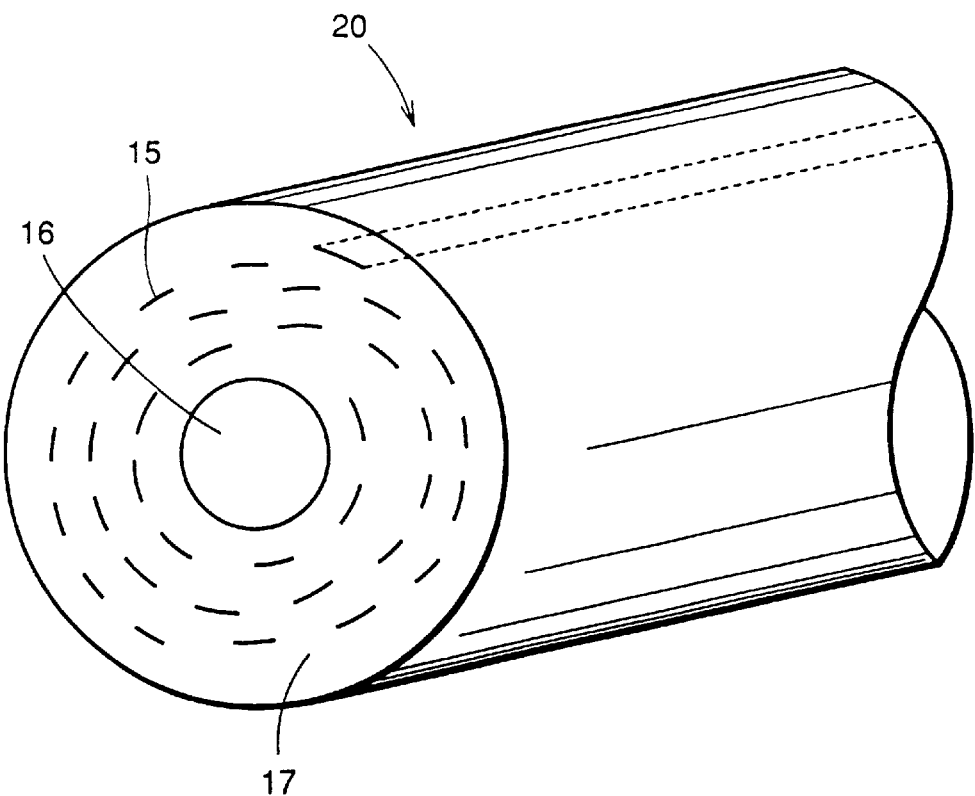
FIG. 2 is a perspective view schematically showing still another exemplary structure of the wire according to the present invention.

FIG. 2 shows still another example having a circular section. A substantially cylindrical stabilizing matrix 16 is arranged at the center of an oxide superconducting wire 20, and a number of filaments 15 are spirally arranged around the matrix 16. A line connecting adjacent ones of the filaments 15 with each other spirally encloses the matrix 16. The filaments 15 are in the form of ribbons extending along the longitudinal direction of the wire 20. The filaments 15 are embedded in a stabilizer matrix 17.

Figure 3:
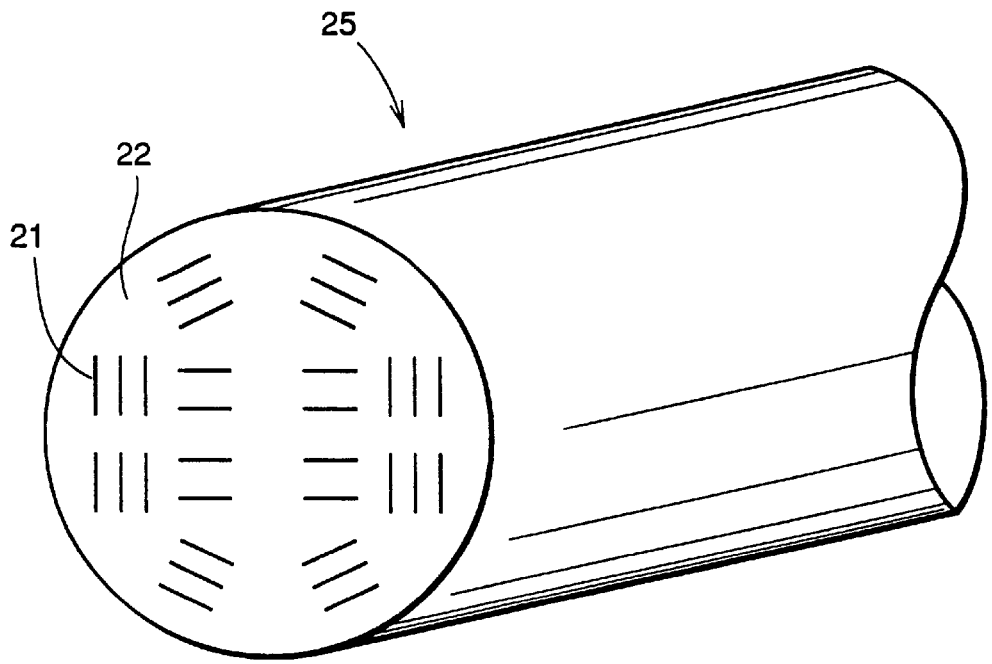
FIG. 3 is a perspective view schematically showing a further exemplary structure of the wire according to the present invention.

An oxide superconducting wire 25 shown in FIG. 3 has no large stabilizing matrix at its center. Alternatively, filaments 21 are arranged throughout a section of the wire 25. The filaments 21, which are partially layered in a stabilizer matrix 22, are arranged along various directions, at least in two directions perpendicular to each other.

The wire according to the present invention is prepared by the so-called powder-in-tube method. The powder-in-tube method is adapted to obtain a wire by charging powder of an oxide superconductor or raw material which can form an oxide superconductor in a tube of a stabilizer and performing plastic working and a heat treatment on the tube. In preparation of the raw material powder, powder materials of oxides or carbonates of elements constituting the superconductor are blended at prescribed blending ratios and sintered, and the obtained sinter is thereafter pulverized. The tube which is charged with the powder consists essentially of silver or a silver alloy, for example. Drawing, rolling, press working or the like is employed for the plastic working.

In the method of preparing an oxide superconducting wire according to the present invention, plastic working is performed on the tube which is charged with the raw material powder, for obtaining a tape-shaped wire. Drawing and rolling can be employed for obtaining the tape-shaped wire. In the obtained tape-shaped wire, a portion consisting of the raw material powder is in the form of a ribbon having an aspect ratio of 4 to 40, preferably 4 to 20. The tape-shaped wire may be either single-filamentary or multifilamentary. It is important to set the aspect ratio of the raw material powder portion in the prescribed range, in order to obtain a wire having excellent superconducting properties. The obtained tape-shaped wire is generally cut into a plurality of wires. The obtained plurality of tape-shaped wires are then charged in a tube consisting essentially of a stabilizer. The tape-shaped wires are preferably charged in the tube by methods described later, while the present invention is not restricted to these method. Plastic working is performed on the tube which is charged with the tape-shaped wires, to obtain a wire having a substantially circular or substantially rotation-symmetrical n-gonal (n: integer of at least 6) section. Drawing can be mainly employed for this plastic working. A heat treatment is performed on the obtained wire, for forming a sinter of the oxide superconductor. In the aforementioned process, a wire having oxide superconducting filaments each having a thickness of 5 to 50 $\mu$m is obtained according to the present invention.

In the step of charging the tape-shaped wires in the tube, a prismatic stabilizer having a regular n-gonal (n: integer of at least 6) sectional shape, for example, is provided and the tape-shaped wires can be stacked around the same. The tape-shaped wires can be stacked around the stabilizer in one or more layers. The tape-shaped wires are preferably symmetrically stacked with respect to the center of the stabilizer. In this charging step, the tape-shaped wires can be arranged in the tube with substantially no clearance. The process employing this step can produce a wire having not only a high density of the oxide superconductor but such an excellent property that superconductivity such as the critical current density is not much varied with the direction of application of a magnetic field.

In the step of charging the tape-shaped wires in the tube, alternatively, a sheet consisting essentially of a stabilizer is first provided and then a plurality of tape-shaped wires can be arranged thereon in parallel with each other. Then, the sheet provided with the plurality of tape-shaped wires is wound on a cylindrical stabilizer. Alternatively, the tape-shaped wires may be placed around a cylindrical stabilizer together with a stabilizer sheet for covering and fixing the wire. Through these steps, a structure having the tape-shaped wires spirally arranged around the cylindrical stabilizer is obtained. The sheet is spirally wound on the cylindrical stabilizer. The structure can be inserted in the tube. In the above steps, the tape-shaped wires can be charged in the tube in a high density. When plastic working such as drawing is performed on the tube charged with the tape-shaped wires, force is substantially uniformly applied to all tape-shaped wires in the tube, whereby uneven distribution of the superconductors in the section is prevented.

In the step of charging the tape-shaped wires in the tube, further, it is also preferable to charge the tape-shaped wires in the space of the tube with substantially no clearance. The charge density of the tape-shaped wires in the tube is preferably at least 90%. In this case, a plurality of stacked tape-shaped wires can be first charged in the tube, and then tape-shaped wires are further charged in the clearances therebetween. In this step, the tape-shaped wires can be readily charged in the tube in a high density.

Figure 4:
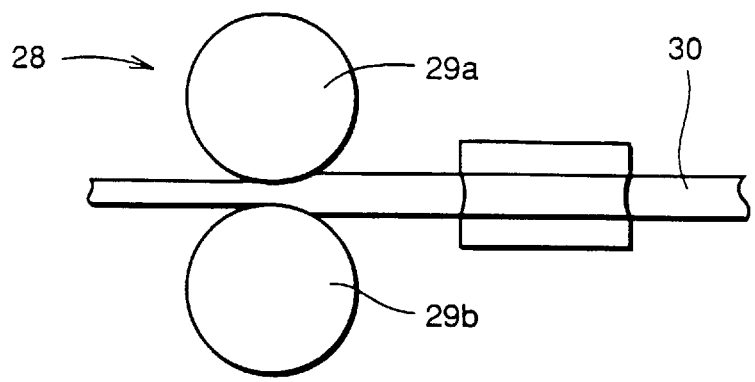
FIG. 4 is a side elevational view showing a driving roller die employed in the present invention.

In the step of performing plastic working on the tube charged with the tape-shaped wires, drawing can be performed. It is more preferable to employ a driving roller die for the drawing. Referring to FIG. 4, a driving roller die 28 has two opposite rollers 29a and 29b grooved to define a specific hole shape. A wire 30 is passed through the hole between the rollers 29a and 29b, to be drawn. As compared with general hole die drawing, this drawing has such advantages that (1) the die is less worn, (2) a larger area reduction ratio can be obtained for a single drawing, (3) the drawing limit becomes higher, and the like. A wire having a higher density of the superconducting phase can be obtained by drawing with the driving roller die. It is more preferable to perform the drawing with a polygonal driving roller die having rollers which are so grooved that the drawn wire has a substantially rotation-symmetrical polygonal section. In this case, the wire is so worked that the superconductor portions therein become flatter in addition to the aforementioned effects, whereby c-axis orientation in the superconducting phase of the wire is remarkably improved.

After the heat treatment is performed on the drawn wire, further drawing can be performed so that the area reduction ratio of the wire section is at least 5% and not more than 50%, followed by a further heat treatment. When the wire is heat treated a plurality of times and further drawing is performed between the heat treatments, the superconducting phase in the heat treated wire can be re-arranged so that c-axis orientation is further increased and the density of the superconducting phase is further improved. The aforementioned effects cannot be sufficiently attained if the area reduction ratio is less than 5% in the drawing, while longitudinal bonding of the superconducting phase is remarkably easy to separate if the area reduction ratio is in excess of 50%.

The further drawing can be performed with the driving roller die, preferably the polygonal driving roller die. Due to this step, the effects of improving the c-axis orientation of the superconducting phase and high densification thereof can be further increased.

The stabilizer employed in the present invention can be selected from the group consisting of silver, silver alloys and combinations thereof. The silver alloys include Ag—Au, Ag—Mn, Ag—Al, Ag—Sb, Ag—Ti alloys, and the like, but are not restricted to these. When the stabilizer is prepared from the silver alloy, a wire having high strength and a higher bending or tensile property can be obtained. According to the present invention, a wire employing an oxide superconductor such as a bismuth, thallium or yttrium based oxide superconductor is provided. In particular, each superconducting filament preferably consists essentially of a bismuth based oxide superconductor mainly composed of a bismuth 2223 phase such as $Bi_2Sr_2Ca_2Cu_3O_{10-x}$ or $(Bi, Pb)_2Sr_2Ca_2Cu_3O_{10-x}$, or a bismuth 2212 phase such as $Bi_2Sr_2Ca_1Cu_2O_{8-z}$ or $(Bi, Pb)_2Sr_2Ca_1Cu_2O_{8-z}$. In the case of forming a sinter of the bismuth based oxide superconductor, the heat treatment is preferably performed at a temperature in the range of 700 to 900° C. As to the bismuth based oxide superconductor, a superconducting wire which has a high critical temperature, a high critical current density and low toxicity and can be readily formed by working is obtained.

A stranded wire according to the present invention is formed by twining a plurality of the aforementioned oxide superconducting wires, and its section is flatly shaped. In the twined wires, the aspect ratio of superconducting filaments is preferably about 10. When the stranded wire is flatly shaped, the strands are so fully transposed that the impedances thereof can be equalized to each other in the stranded wire. When a multifilamentary wire is merely twisted, the filaments may be insufficiently transposed. The stranded wire having a rectangular section can be densely wound when applied to a coil or a cable, to advantageously obtain a compact structure.

The twining step can be carried out after all heat treatment steps as to wires (round or polygonal wires) having sufficiently high critical currents. Alternatively, the heat treatment may be performed after the twining step.

As compared with a twisted multifilamentary wire, transposition is more desirable in the flatly shaped stranded wire having the twined wires. While filaments of the twisted wire may be bridged to remarkably reduce the effect of transposition, such a disadvantage is prevented by such a stranded wire structure.

Stranded wires prepared according to the present invention can be further twined. A structure fully transposing all wires can be provided in such an at least secondary stranded wire, for providing a higher capacitance.

When a high-resistance metal coating layer or an inorganic insulating coating layer is provided on the outer side the stabilizer of the strands in the stranded wire, electromagnetic coupling between the twined strands can be reduced or prevented, the effect of transposition is more satisfactorily attained, and coupling loss between the strands can be reduced. The term "high-resistance metal" indicates a metal exhibiting higher specific resistance than silver employed as the stabilizer. In more concrete terms, a metal exhibiting resistivity of at least $0.7 \times 10^{-8}$ $\Omega \cdot m$ at the liquid nitrogen temperature of about 77 K and at least $3 \times 10^{-8}$ $\Omega \cdot m$ at the room temperature is preferably employed. The high-resistance metal can include nickel, chromium or the like.

Figure 5:
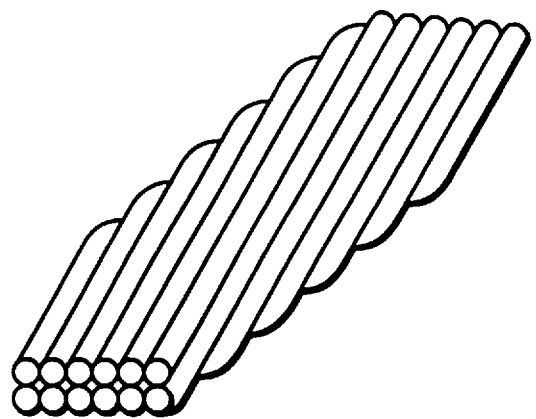
FIG. 5 is a perspective view schematically showing an exemplary structure of the stranded wire according to the present invention.

A method of preparing a stranded wire according to the present invention can comprise the steps of twining a plurality of wires in which powder of an oxide superconductor or raw material therefor is covered with a stabilizer to obtain a stranded wire, flatly shaping the obtained stranded wire, and heat treating the flatly shaped stranded wire at a temperature of at least 700° C. and not more than 900° C. In the process, a plurality of wires in which powder of an oxide superconductor or raw material therefor is covered with a metal, and which are not yet finally sintered, are twined into a stranded wire. The number of the twined wires is preferably 12, 7 or the like, for example. The obtained stranded wire is flatly shaped as shown in FIG. 5, for example. Thereafter a heat treatment is performed at a temperature of at least 700° C. for recovering the stranded wire from deterioration of grain boundaries resulting from bending in twining or the like, and for completing reaction if the reaction is insufficient, thereby obtaining a shaped stranded wire having a high critical current density in which crystal grains of the oxide superconductor are strongly bonded with each other.

In the step of obtaining the stranded wire, a metal layer having high resistivity or an inorganic insulating layer can be provided on the outer side of the stabilizer of silver or a silver alloy. Such a layer can be prepared by covering a silver pipe with a metal pipe, winding a metal sheet around the silver pipe, or plating the silver pipe with a metal, for example. If such a high-resistance metal layer or an inorganic insulating layer is not provided, silver forming the matrix may be so diffused during the heat treatment that the wires are disadvantageously bonded with each other to increase coupling loss between the wires. The high-resistance layer is effective for reducing such coupling loss. The high-resistance layer can be formed by an Ag—Au alloy or an Ag—Mn alloy, for example. Alternatively, Ni or Cr having high resistance may be deposited by plating. The inorganic insulating layer can be formed by applying a solution prepared by dispersing powder of an insulator consisting of a metal oxide such as $Al_2O_3$, $SiO_2$ or the like and then baking by draying and heating, for example. On the other hand, an oxide insulating layer may be an MgO layer or a CuO layer prepared by oxidizing Mg or Cu, for example. Coupling between the wires can be prevented by such an insulator layer. Further, the effect of transposition is rendered more desirable. In addition, excellent workability in twining is attained by depositing Mg or Cu on the wires and then oxidizing Mg or Cu after the twining.

When the stranded wire is a multifilamentary wire, reduction of the critical current density can be prevented with respect to bending distortion in twining. When a twisted multifilamentary wire is employed as the strand, an effect of transposition of the filaments in the strand is attained in addition to transposition of the strands.

A conductor having low loss and high capacitance can be obtained by performing twining and flat-shaping a plurality of times. The obtained conductor is useful as a compact conductor having low loss and high capacitance.

Further, a superconducting conductor can be obtained by spirally winding the stranded wires according to the present invention on a cylindrical core in one or more layers. The core generally has flexibility. The core, which is generally called a former, is adapted to hold tape-shaped superconducting wires in a bending distortion ratio within a prescribed range. The former has a necessary length for a superconducting cable conductor, and provided at the center of the superconducting cable conductor. The former can be provided in a substantially cylindrical or spiral shape, for winding tape-shaped wires thereon. The former generally has a substantially constant diameter along its overall length. The former can consist essentially of at least one material selected from the group consisting of stainless steel, copper, aluminum and FRP (fiber-reinforced plastic), for example.

In a single-layer conductor, the positions of all wires can be electromagnetically equalized by transposition. In this case, current distribution in the conductor is uniformalized, whereby increase of ac loss resulting from current drift can be prevented. In case of spirally winding the wires on the core, it is effective to wind the wires in two layers along opposite directions, in order to cancel magnetic field components in the longitudinal direction of the conductor. When the conductor has at least two layers of the wires, it is desired to prevent or minimize current drift between the layers resulting from difference between the impedances of the layers, as well as the increase of ac loss.

EXAMPLE 1

[Preparation of Wire for Engagement]

$Bi_2O_3$, PbO, $SrCO_3$, $CaCO_3$ and CuO were mixed with each other so that Bi, Pb, Sr, Ca and Cu were in the ratios of 1.81:0.30:1.92:2.01:3.03. The mixture was repeatedly heat treated and pulverized, for obtaining powder which was a precursor for an oxide superconductor. The obtained powder was charged in a silver pipe of 25 mm in outer diameter and 22 mm in inner diameter, which in turn was drawn to 1.45 mmØ and then rolled so that its section was 3.2 mm in width and 0.3 mm in thickness, thereby preparing a tape-shaped wire for engagement.

[Engagement of Tape-Shaped Wires]

Figure 6:
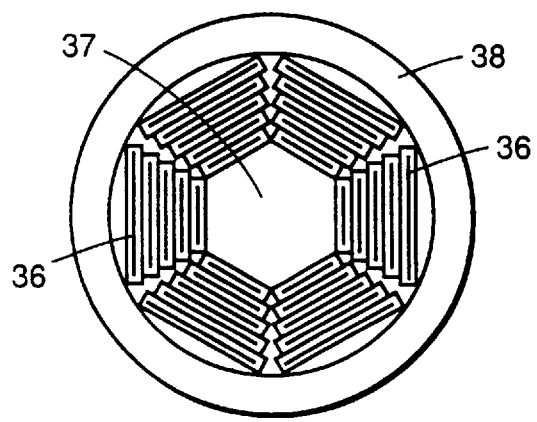
FIG. 6 is a sectional view showing a pipe charged with flat wires for engagement along with a hexagonal-prismatic stabilizer in Example 1 of the present invention.

As shown in FIG. 6, wires 36 for engagement obtained in the aforementioned manner were arranged in five layers along each side surface of a silver stem 37 which was shaped with a hexagonal die of 3 mmφ, and engaged in a silver pipe 38 of 12 mm in outer diameter and 10 mm in inner diameter. In the arrangement, the tape-shaped wires for engagement obtained through the aforementioned process were further pressed or rolled, for further preparing four types of tape-shaped wires which were slightly different in width from the original ones. The original tape-shaped wires and the newly obtained four types of tape-shaped wires were arranged around the stem. In this arrangement, the widths of the tape-shaped wires were outwardly increased little by little, as shown in FIG. 6. Thus, the wires for engagement were stably arranged in the silver pipe. Both ends of the pipe were sealed, and the pipe charged with the tape-shaped wires was thereafter drawn into 1.63 mmφ. The obtained wire is referred to as a sample a.

Figure 7:
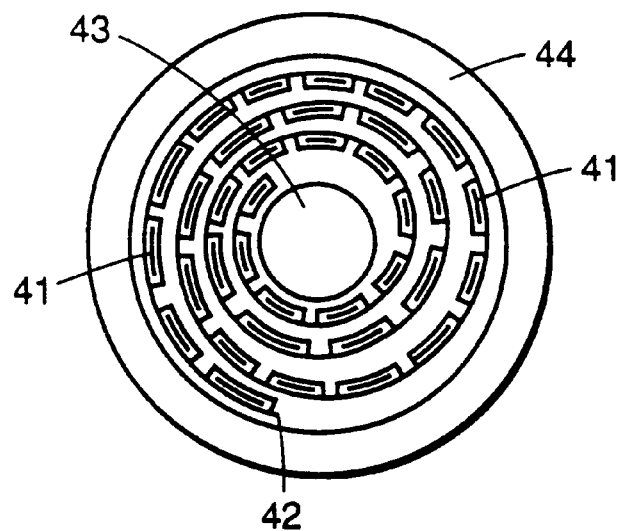
FIG. 7 is a sectional view showing a pipe charged with flat wires for engagement along with a cylindrical stabilizer in Example 1 of the present invention.

As shown in FIG. 7, 35 wires 41 for engagement arranged around a silver stem 43 of 3 mmφ along with a silver sheet 42 were engaged in a silver pipe 44 of 12 mm in outer diameter and 10 mm in inner diameter. In the arrangement, all tape-shaped wires 41 were arranged on the silver sheet 42 in parallel with each other and only both ends of each wire were fixed by an adhesive, and then the silver sheet and the wire were wound on the stem. Alternatively, the tape-shaped wires may be arranged around the stem one by one, while covering with and fixing by the silver sheet. The pipe charged with the tape-shaped wires was drawn into 1.63 mmφ. The obtained wire is referred to as a sample b.

Figure 8:
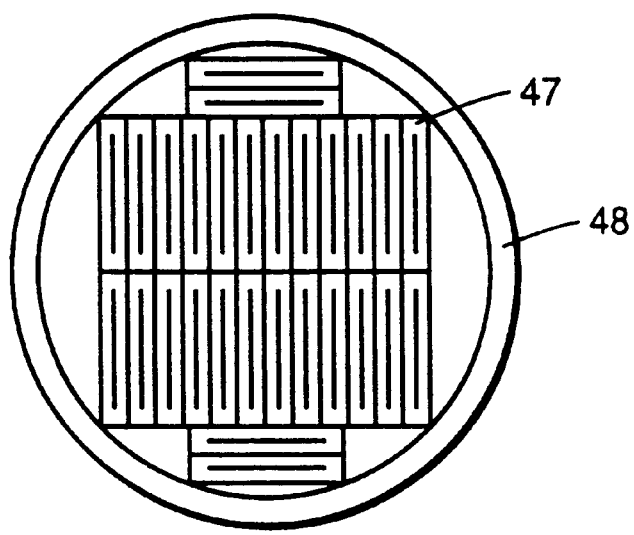
FIG. 8 is a sectional view showing a pipe charged with flat wires for engagement as many as possible in Example 1 of the present invention.

As shown in FIG. 8, wires 47 for engagement were arranged in a silver pipe 48 of 12 mm in outer diameter and 10 mm in inner diameter to be superposed with each other as many as possible (12 wires in this case), while such wires 47 for engagement were also arranged in the remaining space in the silver pipe 48 as many as possible. The pipe charged with the wires was drawn into 1.63 mmφ. The obtained wire is referred to as a sample c.

Figure 9:
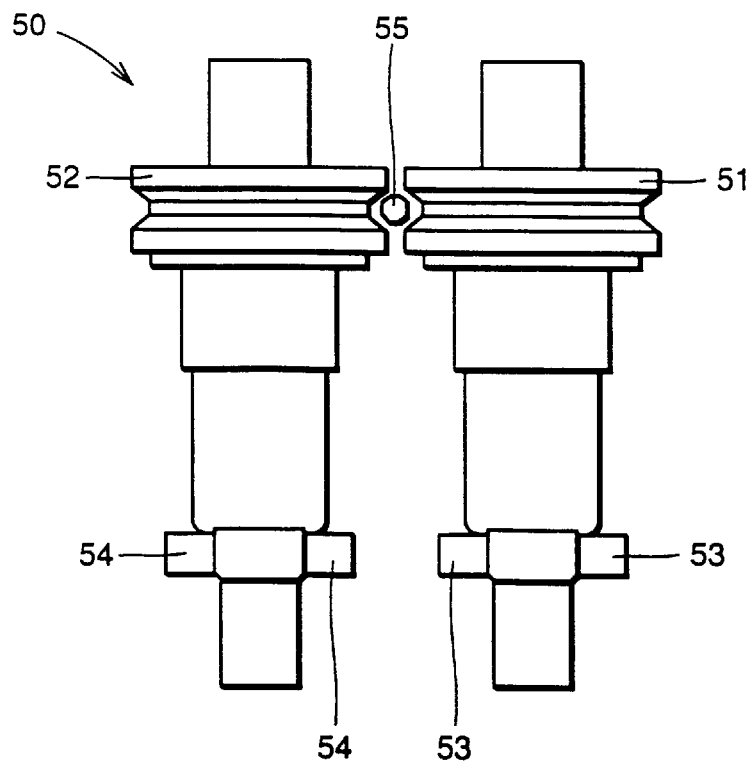
FIG. 9 is a side elevational view showing a polygonal driving roller die employed in the present invention.
Figure 10:
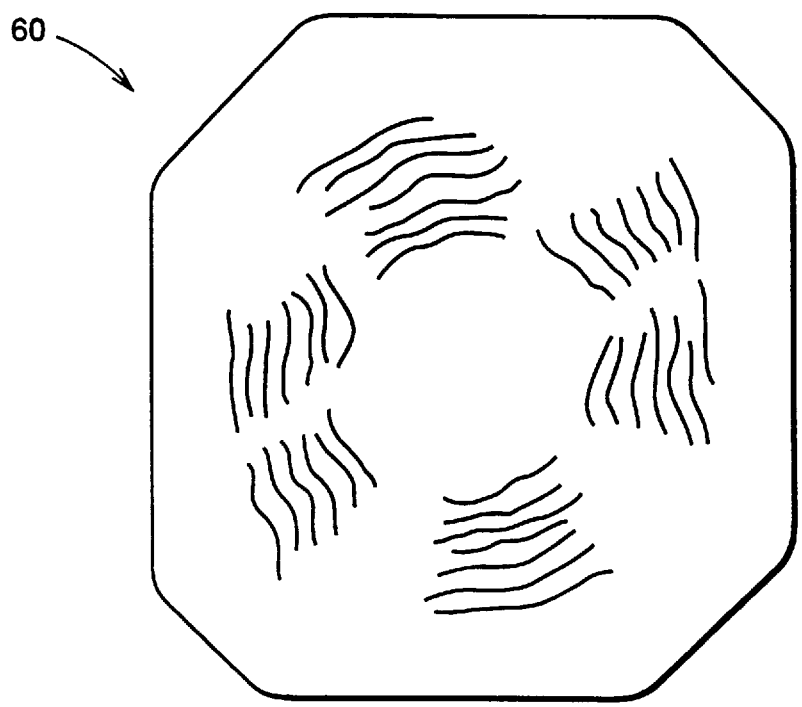
FIG. 10 is a sectional view showing a wire drawn with the polygonal driving roller die in Example 1 of the present invention.

Similarly to the sample a, wires for engagement were arranged in seven layers along each side surface of a silver stem, and engaged in a silver pipe of 12 mm in outer diameter and 10 mm in inner diameter. Then, the pipe charged with the tape-shaped wires was compressed and drawn with a polygonal driving roller die 50 shown in FIG. 9. In the polygonal driving roller die 50, a wire 55 is passed through the hole between driving rollers 51 and 52 which are rotated through bearings 53 and 54 respectively, for drawing. The wire 55 is worked to have a polygonal section depending on the hole shape defined by the driving rollers 51 and 52. FIG. 10 shows a section of a wire 60 obtained by drawing with such a driving roller die. The wire 60 has an octagonal section of about 1.66 mm in diameter. The obtained wire is referred to as a sample d.

[Heat Treatment]

The samples a to d prepared in the aforementioned manner were subjected to treatments shown in Table 1 respectively, for preparing oxide superconducting wires. Referring to Table 1, the obtained wires are referred to as samples A, B, C, D, A', B', C', D', A", B", C" and D" respectively.

TABLE 1

| | Sample | | | |
|---|---|---|---|---|
| Treatment on Wire | a | b | c | d |
| Heat Treatment 1 → Heat Treatment 2 | A | B | C | D |
| Heat Treatment 1 → Drawing 1 → Heat Treatment 2 | A' | B' | C' | D' |
| Heat Treatment 1 → Drawing 2 → Heat Treatment 2 | A" | B" | C" | D" | heat treatment 1: sintering at 845° C. for 50 hours heat treatment 2: sintering at 840° C. for 50 hours drawing 1: drawing up to 1.45 mmφ for attaining an area reduction ratio of about 20% drawing 2: drawing for reducing the diameter to an equivalent diameter of 1.45 mm and attaining an area reduction ratio of about 20% through compression with the polygonal driving roller die

Comparative Example 1

Wires were prepared as comparative examples as follows:

First, $Bi_2O_3$, PbO, $SrCO_3$, $CaCO_3$ and CuO were blended so that Bi, Pb, Sr, Ca and Cu were in the composition ratios of 1.81:0.30:1.92:2.01:3.03. A heat treatment and pulverization were performed a plurality of times similarly to Example 1, for obtaining precursor powder. The obtained powder was charged in a silver pipe of 25 mm in outer diameter and 22 mm in inner diameter, which in turn was drawn to 1.45 mmφ. 61 fragments formed by cutting the obtained wire were bundled and engaged in a silver pipe of 15 mm in outer diameter and 13 mm in inner diameter, which in turn was drawn to 1.63 mmφ. The obtained wire is referred to as a sample e. The sample e was first subjected to the aforementioned heat treatment 1, and then subjected to the heat treatment 2 as secondary sintering. The obtained wire is referred to as a sample E.

On the other hand, the sample e was drawn to 1.63 mmφ, then rolled into 3.6 mm in width and 0.32 mm in thickness, and subjected to the aforementioned heat treatment 1. Further, the wire was rolled into 3.9 mm in width and 0.29 mm in thickness and subjected to the aforementioned heat treatment 2, for obtaining a tape-shaped wire. The obtained wire is referred to as a sample F.

[Characteristics of Wire]

Samples of 7 cm were formed by the respective wires prepared in Example 1 and comparative example 1, and subjected to measurement of critical current densities (Jc) at 77 K by a dc four-probe method. Table 2 shows the results.

EXAMPLE 2

[Study of Aspect Ratio of Superconducting Filament in Wire for Engagement]

The wires drawn to 1.45 mmφ in the section [preparation of wire for engagement] in Example 1 were rolled in various working ratios, so that the internal powder portions were at various aspect ratios. Through the rolling, wires for engagement were obtained with aspect ratios of 3, 5, 20, 30, 40, 50, 60 and 100 in the powder portions respectively. Similarly to preparation of the sample, the obtained wires for engagement were engaged in silver pipes, which in turn were drawn for obtaining round wires of 1.45 mmφ. The heat treatments 1 and 2 were performed to obtain oxide superconducting wires having circular sections. In the obtained wires, the aspect ratios of the powder portions were kept substantially unchanged. In other words, the aspect ratios of the superconducting filaments were substantially equal to those of the powder portions. Table 3 shows critical current densities (Jc) of the wires at 77 K with respect to the aspect ratios of the superconducting filaments. Referring to Table 3, the wire having the aspect ratio of 1 was prepared by engaging the aforementioned wires which were drawn to 1.45 mmφ in a tube in states of round wires with no rolling.

TABLE 3

| Aspect Ratio of Superconducting Filament | 1 | 3 | 5 | 20 | 30 | 40 | 50 | 60 | 100 |
|---|---|---|---|---|---|---|---|---|---|
| Jc (77 K. 0T) (A/cm$^2$) | 1200 | 1800 | 4100 | 6400 | 5400 | 3900 | 2000 | 1400 | 900 |

TABLE 2

| Sample | Jc(A/cm$^2$) | Sample | Jc(A/cm$^2$) | Sample | Jc(A/cm$^2$) |
|---|---|---|---|---|---|
| A | 6100 | A' | 7400 | A" | 9000 |
| B | 5700 | B' | 6800 | B" | 8600 |
| C | 5100 | C' | 6000 | C" | 7500 |
| D | 7600 | D' | 9100 | D" | 11400 |
| E | 1200 | | | | |
| F | 21000 | | | | |

The samples A to D, A' to D' and A" to D" according to the present invention exhibited remarkably higher critical current densities Jc than the comparative round wire (sample E) directly prepared by the powder-in-tube method, although the values Jc were lower than that of the tape-shaped wire (sample F). This is conceivably because the tubes charged with the tape-shaped wires were subjected to drawing. The samples D, D' and D" drawn by the driving roller die exhibited higher critical current densities Jc. It is conceivable that the filament portions were further effectively compacted by the driving roller die.

As understood from Table 3, the critical current density Jc is increased when the aspect ratio of the filaments is increased. If the aspect ratio exceeds 100, however, the critical current density Jc is reduced to the contrary. From this experiment, it has been considered preferable to set the aspect ratio of the superconducting filaments within the range of at least 4 and not more than 40. A wire having a higher critical current density Jc is obtained in this range.

[Study of Thickness of Superconducting Filament]

Table 4 shows the relations between the thicknesses of the superconducting filaments and the critical current densities Jc in the respective wires shown in Table 3.

TABLE 4

| Thickness of Superconducting Filament (μm) | 3 | 6 | 8 | 10 | 12 | 15 | 40 | 50 | 70 |
|---|---|---|---|---|---|---|---|---|---|
| Jc (77 K. 0T) (A/cm$^2$) | 900 | 1400 | 2000 | 3900 | 5400 | 6400 | 4100 | 1800 | 1200 |

As understood from Table 4, the critical current density Jc is increased as the thickness of the filaments is reduced. This is because c-axis orientation of the superconducting phase is promoted in the interface between the same and the metal portion. If the filaments are further reduced in thickness, however, the critical current density Jc is reduced. This is conceivably because longitudinal bonding of the superconducting phase is separated. From this experiment, it has been considered preferable to set the thickness of the filaments within the range of 5 to 50 μm.

EXAMPLE 3

[Study of Area Reduction Ratio in Drawing]

Wires of the aforementioned sample a were subjected to the heat treatment 1, and then drawn in various area reduction ratios. Then, the heat treatment 2 was performed, for obtaining round wires. Table 5 shows the relations between the area reduction ratios in the drawing and the critical current densities Jc of the obtained wires. The wire having the area reduction ratio of 0 was subjected to no drawing.

TABLE 5

| Area Reduction Ratio | 0 | 1 | 3 | 50 | 10 | 20 | 37 | 60 |
|---|---|---|---|---|---|---|---|---|
| Jc (77 K. OT) (A/cm$^2$) | 6100 | 6120 | 6200 | 6800 | 7000 | 7400 | 6800 | 1900 |

As shown in Table 5, the critical current density Jc of the obtained wire is improved when drawing is further performed between two sintering steps. If the area reduction ratio is excessively increased in the drawing, however, the critical current density Jc is reduced. From this experiment, it has been understood possible to improve the critical current density of the wire by drawing the same in an area reduction ratio within the range of 5 to 50%.

[Preparation of Stranded Wire]

EXAMPLE 4

Figure 11:
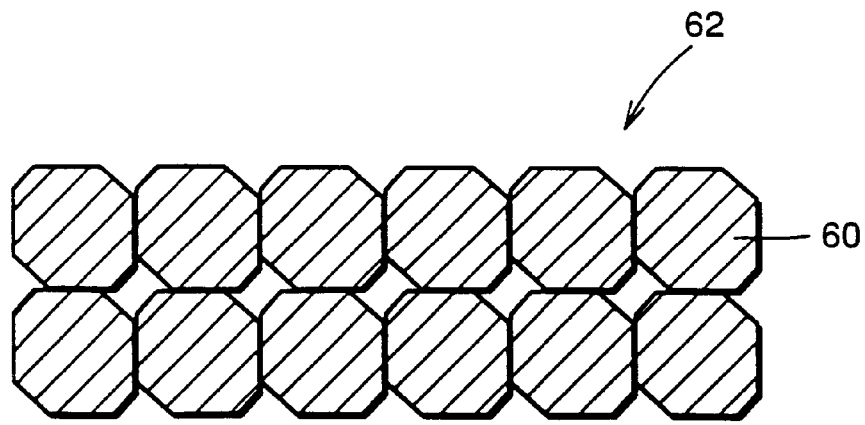
FIG. 11 is a sectional view schematically showing a flat stranded wire obtained in Example 4 of the present invention.

12 wires of the sample D" prepared in Example 1 were twined and the obtained stranded wire was flatly shaped so that its section was 8 mm by 2.7 mm. This stranded wire exhibited a critical current density (Ic) of 240 A. FIG. 11 typically shows a section of the obtained flat stranded wire. 12 wires 60 having substantially rotation-symmetrical octagonal sections are twined into a flat stranded wire 62.

Comparative Example 2

Figure 12:
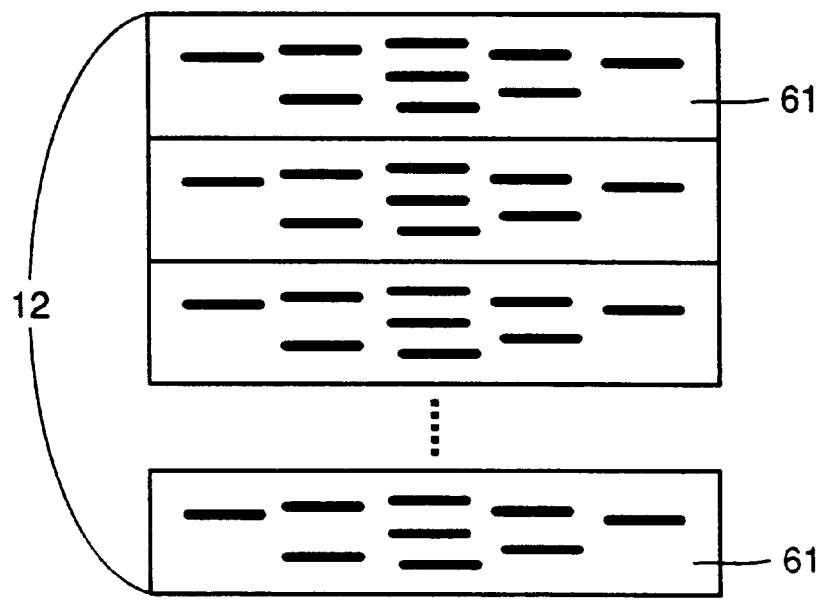
FIG. 12 is a schematic sectional view showing a wire obtained by stacking 12 tape-shaped wires in comparative example 2.

61 wires of 1.45 mmφ prepared in comparative example 1 were bundled and engaged in a silver pipe of 15 mm in outer diameter and 13 mm in inner diameter, which in turn was drawn to 1.02 mmφ. Then, the obtained wire was rolled to 0.25 mm, and subjected to the aforementioned heat treatment 1 (at 845° C. for 50 hours). 12 obtained wires were stacked in layer and rolled to 2.5 mm as to the thickness direction of the stacked wires and subjected to the aforementioned heat treatment 2 (at 840° C. for 50 hours), for obtaining a composite wire. FIG. 12 shows the 12 stacked wires 61. Principal surfaces of the wires 61 are superposed with each other. This composite wire exhibited a critical current density Ic of 320 A.

EXAMPLE 5

Figure 13:
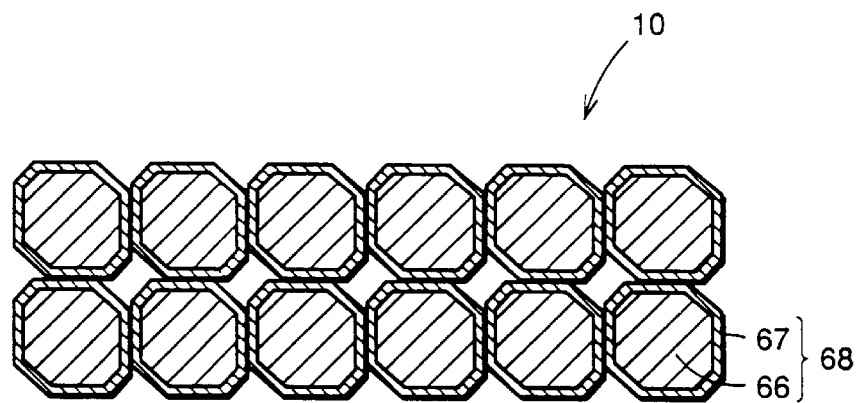
FIG. 13 is a schematic sectional view showing a stranded wire obtained by twining wires plated with a Cr—Ni alloy in Example 5 of the present invention.

Surfaces of wires of the sample D" prepared in Example 1 were subjected to plating of a Cr—Ni alloy. 12 plated wires were twined and the obtained stranded wire was flatly shaped so that its section was 8 mm by 2.7 mm. FIG. 13 shows a section of the obtained stranded wire 65. In the stranded wire 65, surfaces of wires 66 are provided with plating layers 67 of the Cr—Ni alloy. Two layers of six transversely arranged plated wires 68 are superposed with each other. Namely, 12 wires 68 are twined, and the stranded wire 65 is flatly shaped. This stranded wire exhibited a critical current density Ic of 380 A.

[Effect of Twining and Plated Layer With Respect to ac Loss]

The stranded wire and the composite wire prepared in Example 4 and comparative example 2, ac loss values were measured by an energization four-probe method. When energized under conditions of 60 Hz and peaks of 100 A, the ac loss generated in the stranded wire of Example 4 was 0.6 mW/m, while the wire of comparative example 2 exhibited ac loss of 10 mW/m. It has been understood that ac loss was reduced in the stranded wire prepared in Example 4. The stranded wire prepared in Example 5 was also subjected to measurement of ac loss, to prove that the ac loss was further reduced to 0.12 mW/m when energized under conditions of 60 Hz and a peak of 100 A. In the following Examples and comparative examples, all ac loss values were measured by the energization four-probe method.

EXAMPLE 6

Figure 14:
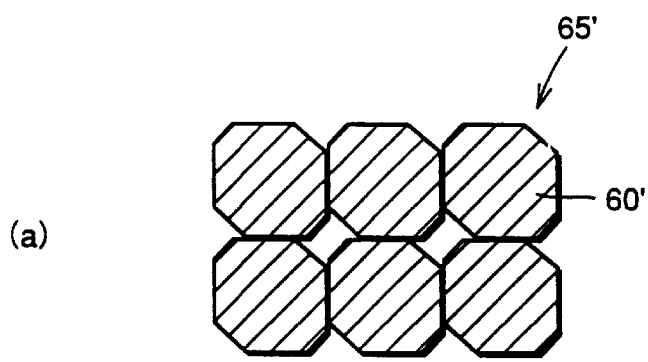
FIG. 14(a) is a schematic sectional view showing a flat stranded wire obtained in Example 6 of the present invention.
FIG. 14(b) is a perspective view showing a twisted wire for forming the stranded wire.
Figure 14:
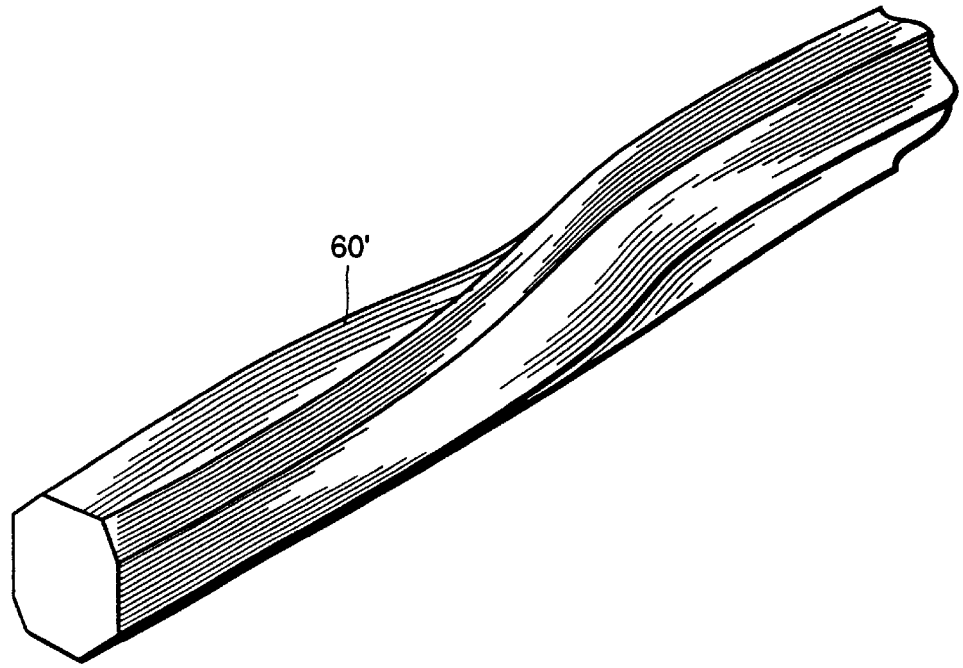

In the process of preparing the sample D' in Example 1, the wire was twisted at pitches of 25 mm before the heat treatment 2. Six twisted wires were then twined, and the obtained stranded wire was flatly shaped so that its section was 4.2 mm by 2.8 mm, and subjected to the heat treatment 2. The obtained stranded wire exhibited a critical current density Ic of 220 A. FIG. 14(*a*) shows the obtained stranded wire. Six wires 60' having substantially rotation-symmetrical. octagonal sections are twined into a flat stranded wire 65'. Each wire 60' is twisted as shown in FIG. 14(*b*).

Comparative Example 3

In the process of comparative example 2, 61 wires were engaged in a silver pipe of 15 mm in outer diameter and 13 mm in inner diameter, which in turn was drawn to 1.45 mmφ. Then, the silver pipe was rolled to 0.3 mm, and subjected to the aforementioned heat treatment 1. Six obtained wires were stacked in layer, rolled to 3.0 mm, and then subjected to the aforementioned heat treatment 2. The obtained composite wire exhibited a critical current density Ic of 250 A.

[Effect of Twisting Before Secondary Sintering With Respect to ac Loss]

The stranded wire and the composite wire prepared in Example 6 and comparative example 3 were subjected to measurement of ac loss. When energized under conditions of 60 Hz and peaks of 100 A, the stranded wire of Example 6 and the wire of comparative example 3 exhibited ac loss values of 0.7 mW/m and 8 mW/m respectively. It has been understood that the ac loss is remarkably reduced when the wires to be twined are twisted before secondary sintering.

EXAMPLE 7

In the process of preparing the sample D' in Example 1, two types of wires were prepared by plating the wires with Mg and Cu in thicknesses of 10 μm respectively before the heat treatment 2. Then six wires were twined as to each type, and the obtained stranded wires were flatly shaped and subjected to the heat treatment 2 similarly to Example 6, for preparing two types of stranded wires. The Cu and Mg plating layers formed on the surfaces of the wires were converted to CuO and MgO layers respectively, so that the wires were substantially completely insulated from each other. These stranded wires exhibited critical current densities Ic of 350 A. The Mg and Cu plating layers provided on the surfaces of the wires were so thin that only oxide films of CuO and MgO were formed on the surfaces of the heat-treated wires and the superconducting properties of the stranded wires were not influenced by the plated Mg and Cu.

[Effect of Oxide Film Formed on Wire With Respect to ac Loss]

The two types of stranded wires prepared in Example 7 were subjected to measurement of ac loss values. The stranded wires formed by the wires with the CuO and MgO films exhibited ac loss values of 0.1 mW/m and 0.09 mW/m respectively when energized under conditions of 60 Hz and peaks of 100 A. It has been confirmed that ac loss, which is coupling loss between the wires, is remarkably reduced when the wires are covered with oxide films.

EXAMPLE 8

Figure 15:
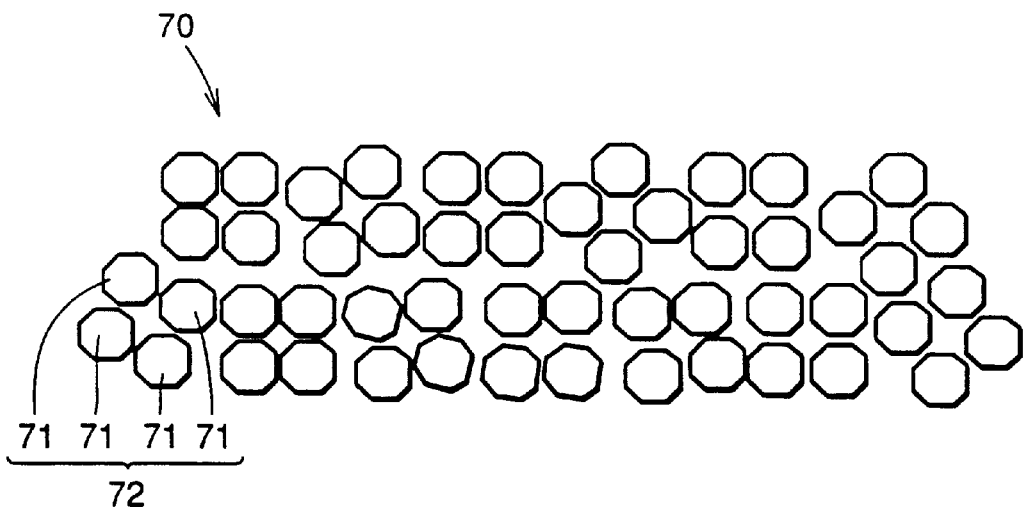
FIG. 15 is a schematic sectional view showing a secondary stranded wire obtained by twining 13 primary stranded wires in Example 8.

The sample d of 1.15 mm in diameter having an octagonal section prepared in Example 1 was subjected to the heat treatment 1 and further drawn with a polygonal driving roller die, for obtaining a wire of 1.02 mm in diameter having an octagonal section. The obtained wire was subjected to the heat treatment 2. Four heat treated wires were twined into a primary stranded wire, and such primary stranded wires were further twined into a secondary stranded wire. FIG. 15 is a sectional view of the obtained secondary stranded wire. The secondary stranded wire 70 is formed by twining 13 primary stranded wires 72, each formed by twining four wires 71. Namely, 52 wires 71 are twined in this secondary stranded wire 70.

The obtained secondary stranded wire was further flatly shaped so that its section was 10.5 mm by 3.5 mm. The obtained secondary stranded wire exhibited a critical current density Ic of 600 A.

Comparative Example 4

12 wires subjected to the heat treatment 1 in comparative example 3 were stacked in layer (see FIG. 11), and integrated with each other through the heat treatment 2. The obtained composite wire exhibited a critical current density Ic of 620 A.

[Effect of Multiple Stranded Wire With Respect to ac Loss]

The stranded wire and the composite wire prepared in Example 8 and comparative example 4 were subjected to measurement of ac loss values. The stranded wire of Example 8 and the composite wire of comparative example 4 exhibited ac loss values of 0.25 mW/m and 3 mW/m respectively when energized under conditions of 51 Hz and peaks of 200 A. It is understood that ac loss is reduced in the multiple stranded wire.

EXAMPLE 9

Figure 16:
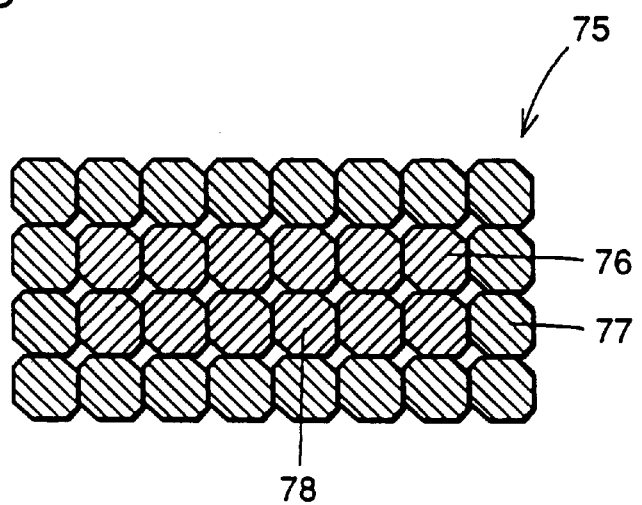
FIG. 16 is a schematic sectional view showing a stranded wire obtained by winding wires on a primary stranded wire in Example 9 of the present invention.

20 wires prepared in Example 1 were wound on a core of the flat stranded wire prepared in Example 4. Then, the obtained structure was shaped to have a flat section, for preparing a stranded wire. FIG. 16 shows the obtained stranded wire. A stranded wire 78 formed by twining 12 wires 76 is provided at the center of the stranded wire 75, and 20 wires 77 are wound thereon. The stranded wire 75 is flatly shaped so that its section is 11 mm by 5.2 mm. The obtained stranded wire exhibited a critical current density Ic of 500 A.

Comparative Example 5

18 wires of comparative example 2 were stacked in layer, rolled to 2 mm and subjected to the heat treatment 2, for obtaining a composite wire. The obtained composite wire exhibited a critical current density Ic of 480 A.

[Effect of Flatly Shaped Stranded Wire With Respect to ac Loss]

As a result of measurement of ac loss values, the stranded wire and the composite wire prepared in Example 9 and comparative example 5 exhibited ac loss values of 0.3 mW/m and 2 mW/m respectively when energized under conditions of 50 Hz and peaks of 100 A. It is understood that the ac loss is reduced in the stranded wire obtained according to the present invention.

[Preparation of Superconducting Conductor]

EXAMPLE 10

Figure 17:
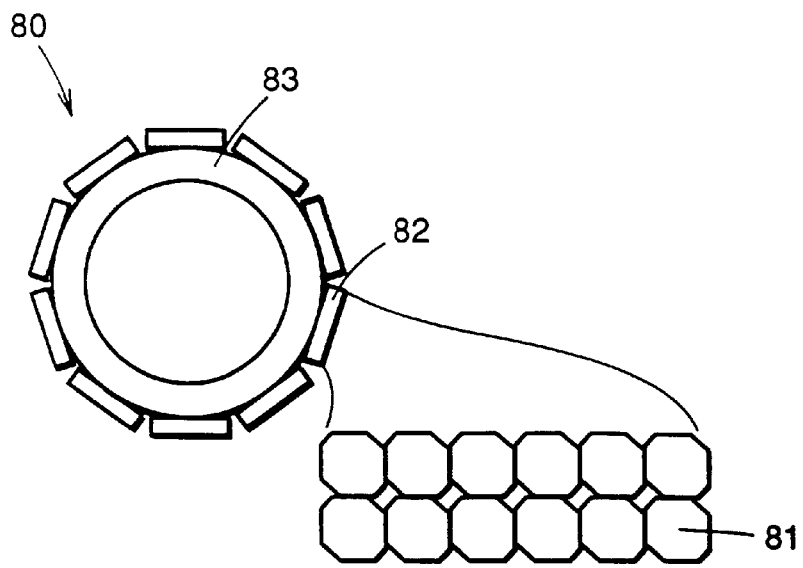
FIG. 17 is a schematic sectional view showing a conductor obtained by winding stranded wires on a copper pipe in Example 10 of the present invention.

10 flat stranded wire prepared in Example 4 were spirally wound on a copper pipe of 28 mm in outer diameter, for preparing a superconducting conductor. FIG. 17 is a sectional view showing the obtained superconducting conductor. Referring to FIG. 17, 10 stranded wire 82, each formed by twining 12 wires 81, are spirally wound on a copper pipe 83 in the conductor 80. The obtained conductor exhibited a critical current density Ic of 2200 A.

Comparative Example 6

Figure 18:
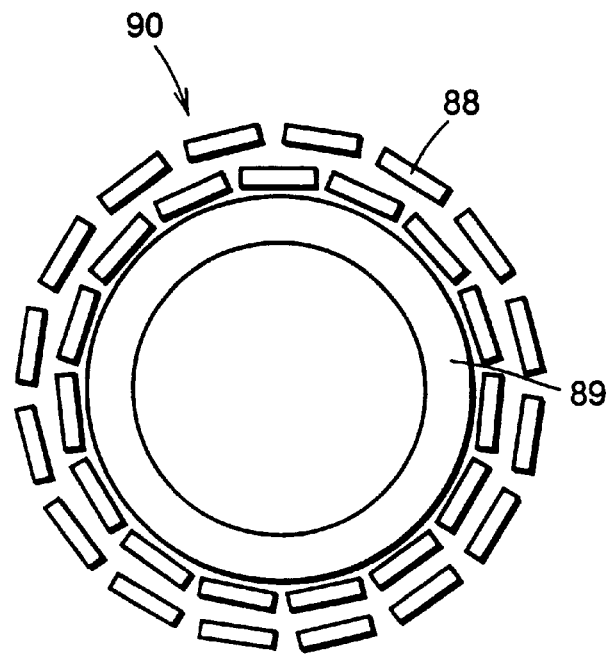
FIG. 18 is a schematic sectional view showing a conductor obtained by winding tape-shaped wires on a copper pipe in two layers in comparative example 6.

The round wire e prepared in comparative example 1 was rolled so that its section was 0.46 mm by 5.2 mm, subjected to the heat treatment 1, further rolled so that its section was 0.41 mm by 5.5 mm, and subjected to the heat treatment 2, for obtaining a wire. 31 obtained wires were spirally wound in two layers on a copper pipe of 28 mm in outer diameter, for preparing a two-layer conductor. FIG. 18 is a sectional view showing the two-layer conductor. Referring to FIG. 18, wires 88 are spirally wound on a copper pipe 89 in two layers consisting of inner and outer layers of 15 and 16 wires 88 respectively in the two-layer conductor 90. In the obtained conductor, each wire exhibited a critical current density Ic of 70 A. The obtained conductor exhibited a critical current density Ic of 2100 A.

[Effectiveness of Single-Layer Stranded Wire Conductor]

When the ac loss values of the conductors prepared in Example 10 and comparative example 6 were compared with each other, the former was smaller by two orders than the latter. Thus, effectiveness of the single-layer stranded wire conductor according to the present invention was confirmed.

According to the present invention, as hereinabove described, the critical current density can be improved in an oxide superconducting wire having a circular sectional shape or an at least hexagonal polygonal sectional shape which is substantially rotation-symmetrical, by engaging tape-shaped oxide superconducting wires obtained by pressing or rolling in the pipe consisting essentially of silver or a silver alloy and drawing the same. Further, a superconducting stranded wire reducing ac loss can be obtained by employing the inventive wires. Further, a conductor having small ac loss can be obtained by employing such stranded wire.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing an oxide superconducting wire comprising a plurality of oxide superconductor filaments embedded in a stabilizer, said method comprising:

charging powder of a member selected from the group consisting of said oxide superconductor and a raw material for said oxide superconductor in a tube or tubes consisting essentially of said stabilizer;

drawing and rolling said tube or tubes charged with said powder to obtain a plurality of tape-shaped wires, each having a portion of said powder in the form of a ribbon having an aspect ratio of 4 to 40;

arranging said plurality of tape-shaped wires in parallel on a sheet consisting essentially of a stabilizer;

winding said sheet with said tape-shaped wires on a substantially circular stabilizer;

inserting said circular stabilizer on which said tape-shaped wires are wound into a cylindrical tube consisting essentially of a stabilizer;

performing plastic working on said tube in which said tape-shaped wires have been inserted to obtain a wire having a shape selected from the group consisting of a substantially circular sectional shape and an at least hexagonal polygonal sectional shape which is substantially rotation-symmetrical; and performing a heat treatment on said wire to obtain a sintered oxide superconductor and produce an oxide superconducting wire comprising a plurality of oxide superconductor filaments embedded in a stabilizer, each oxide superconductor filament having a thickness within the range of 5 to 50 μm.

2. The method of preparing an oxide superconducting wire in accordance with claim 1, wherein said plurality of tape-shaped wires are inserted in said tube in a charge density of at least 90% in said step of inserting said plurality of tape-shaped wires.

3. The method of preparing an oxide superconducting wire in accordance with claim 1, wherein said step of performing plastic working on said tube charged with said tape-shaped wires comprises drawing with a driving roller die.

4. The method of preparing an oxide superconducting wire in accordance with claim 1, further comprising the steps of performing drawing for attaining an area reduction ratio of at least 5% and not more than 50% on a section of said wire and then performing a heat treatment on said wire for sintering said oxide superconductor.

5. The method of preparing an oxide superconducting wire in accordance with claim 4, wherein said drawing is performed with a driving roller die.

6. The method of preparing an oxide superconducting wire in accordance with claim 1, wherein said stabilizer is selected from the group consisting of silver, silver alloys and combinations thereof, said heat treatment is performed at a temperature within the range of 700 to 900° C., and said oxide superconductor is a bismuth oxide superconductor mainly composed of a bismuth 2223 or 2212 phase.

7. The method in accordance with claim 1, wherein, following said heat treatment, said oxide superconducting wire is drawn to reduce the area by at least 5% and not more than 50% on a section of said tube, and then subjected to a further heat treatment.

8. The method in accordance with claim 7, wherein said drawing is performed with a driving roller die.

* * * * *